(12) United States Patent
Detmers et al.

(10) Patent No.: US 7,460,141 B2
(45) Date of Patent: Dec. 2, 2008

(54) APPARATUS FOR IMAGING ON A RECORDING MEDIUM

(75) Inventors: Andreas Detmers, Heddesheim (DE); Christian Meier, Schriesheim (DE); Ingo Ringle, Eppelheim (DE); Thomas Rupp, Heidelberg (DE); Wolfgang Theiss, Heidelberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 424 days.

(21) Appl. No.: 11/256,599

(22) Filed: Oct. 21, 2005

(65) Prior Publication Data
US 2006/0119699 A1  Jun. 8, 2006

(30) Foreign Application Priority Data
Oct. 21, 2004 (DE) .................. 10 2004 051 322

(51) Int. Cl.
*B41J 2/435* (2006.01)
(52) U.S. Cl. ....................... 347/133; 347/236
(58) Field of Classification Search .............. 347/234, 347/248, 236, 246, 133
See application file for complete search history.

(56) References Cited

U.S. PATENT DOCUMENTS 4,780,731 A   10/1988  Creutzmann et al.
5,432,537 A   7/1995   Imakawa et al.
6,798,437 B2*  9/2004  Seibert ................. 347/234
7,189,011 B2*  3/2007  Harker ................. 385/89

FOREIGN PATENT DOCUMENTS

| DE | 35 34 338 A1 | 4/1987 |
| DE | 199 42 551 A1 | 3/2001 |
| DE | 101 29 874 A1 | 1/2003 |
| DE | 103 09 483 A1 | 10/2003 |
| EP | 1 403 985 A1 | 3/2004 |

* cited by examiner

*Primary Examiner*—Huan H Tran
(74) *Attorney, Agent, or Firm*—Laurence A. Greenberg; Werner H. Stemer; Raph E. Locher

(57) ABSTRACT

An imaging apparatus for imaging on a recording medium is improved to permit the imaging power to be balanced between various groups of individual radiation sources with a low outlay and high accuracy. Two or more imaging heads that respectively include a multiplicity of individual radiation sources that can be electrically driven individually with light beams directed onto a radiation-sensitive layer of the recording medium. A drive moves the recording medium and the radiation sources relative to one another. A control device controls the power of the light beams of the radiation sources separately for each imaging head. A least one light guide is provided that guides a portion of the light beams emanating from the radiation sources to the receiver surface of a photoelectric sensor, which sensor is connected to the control device.

6 Claims, 4 Drawing Sheets

APPARATUS FOR IMAGING ON A RECORDING MEDIUM

BACKGROUND OF THE INVENTION

Field of the Invention

The invention relates to an apparatus for imaging on a recording medium. The apparatus has at least two imaging heads that respectively include a multiplicity of individual radiation sources that can be electrically driven individually and whose light beams are directed onto a radiation sensitive layer of the recording medium. A drive moves the recording medium relative to the radiation sources. And, a control device drives the power of the light beams of the radiation sources separately for each imaging head.

Apparatuses for producing printing forms are known wherein lasers are used to produce ink-accepting or ink-repelling image points on a printing form blank. A number of lasers are used simultaneously in order to produce a printing form in as short a time as possible. Individually drivable laser diodes of a laser diode array are particularly suitable. It is typical to combine 64 laser diodes in a laser diode array. A laser diode array can be arranged in an imaging head together with the components driving the laser diodes, and with optical imaging elements, the imaging head being provided such that it can be displaced parallel to the axis of rotation of a printing from cylinder. A number of imaging heads are arranged on a slide and displaced jointly parallel to the axis of rotation of the printing form cylinder in order to raise productivity further. In this case, image points are generated in a zone with the aid of an imaging head. The zone width lying in the direction of the axis of rotation is yielded from the number of the imaging heads used. In order that there be no density differences visible in the printed image between the zones, the power of the laser beams of the laser diode array must be balanced. High requirements are placed on the power balancing, because the human eye is capable of detecting density differences of 0.5%.

The power of a beam emitted by a laser diode on the surface of a printing form blank depends on various parameters. The power can be set by controlling the conducting-state current. The power of a laser diode is not constant over the service life of the latter. Because of a degradation of the laser diodes, and of a change in the transmission of the optically imaging elements owing to soiling, the power must be balanced afresh from time to time. In order to balance the power, it is possible to arrange in the beam path of a laser diode a photoelectric sensor that is connected to a control device for the conducting-state current. The sensor can be used to determine the actual power, which is compared with a desired power in the control device. The control device is used to generate a manipulated variable for the conducting-state current that is fed to an actuator for the current and counteracts a deviation between the desired and actual values of the power. If use is made of a sensor for each laser diode array or for each laser diode, it must then be ensured that the sensors have identical sensor characteristics and long-term stabilities. Even in the case of careful selection of the sensors, errors occur during power balancing that are caused by different aging and/or different temperature characteristics.

It is known, moreover, from German published patent application DE 101 29 874 A1 to provide only one power sensor that is arranged in the movement region of laser channels. Each laser channel is positioned in front of the power sensor and measured for the purpose of power balancing. For this purpose, the laser channels must be moved laterally next to a printing form cylinder. Problems with installation space arise when integrating the imaging apparatus into a printing machine and in the event of a multiplicity of laser modules arranged next to one another.

The power balancing of lasers can also be undertaken during test imaging. In this case, the density is measured on a printing form, or with the aid of a printed image printed using the printing form. This method is complicated, because a number of test imagings are required as a rule.

U.S. Pat. No. 4,780,731 and German published patent application DE 35 34 338 A1 disclose an electrophotographic printer having an exposure energy correction device and in the case of which the radiative power of light-emitting diodes is measured with the aid of a photoelement, and the switch-off time is controlled by means of the measurement signals. The photoelement is displaced with the aid of a drive along the light-emitting diodes arranged in a straight line. The drive for the photoelement is expensive. It is necessary to adapt the drive elements and photoelements to the narrow installation space between light-emitting diodes and photoconductor drum.

Assigning a light sensor to each laser diode is known from U.S. Pat. No. 5,432,537 for the purpose of controlling the power of laser diodes. Located in the beam path of the laser diodes next to lenses is a semi-reflecting mirror that directs a portion of the laser beams onto the light sensors. The geometric beam guidance cannot be implemented in each case when there are cramped conditions of space between laser diode and imaging drum.

In the case of the method for driving laser diodes according to U.S. Pat. No. 6,836,343 and German published patent application DE 199 42 551 A1, crosstalk between two laser diodes is compensated electronically with the aid of a quadripole. From the driver current of the first laser diodes, the quadripole forms a correction signal that serves for correcting a driver current of the second laser diodes. The time characteristics of the light powers are measured in order to determine the transfer functions of the quadripole, this being possible only with finite accuracy.

U.S. Pat. No. 6,603,498 B1 has a printing head with a laser diode array and a photoreceiver array. The laser diodes of the laser diode array transmit the light in a main beam direction onto a printing form blank. The photoreceivers of the photoreceiver array are arranged in a secondary beam path. The driver current of the laser diodes is controlled with the aid of the signals of the photoreceivers. The signals of the photoreceivers are proportional to the radiant power of the laser beams in the main beam direction. The power measurement is defective because no account is taken of the variation of the power in the optical transmission paths when measuring the laser power.

SUMMARY OF THE INVENTION

It is accordingly an object of the invention to provide an apparatus for imaging a recording medium which overcomes the above-mentioned disadvantages of the heretofore-known devices and methods of this general type and which enables power to be balanced between various groups of individual radiation sources with low outlay and high accuracy.

With the foregoing and other objects in view there is provided, in accordance with the invention, an apparatus for imaging on a recording medium, the apparatus comprising:

at least two imaging heads each having a multiplicity of individual radiation sources electrically driven individually to direct respective light beams onto a radiation-sensitive layer of the recording medium;

a drive for moving the recording medium and the radiation sources relative to one another;

a control device connected to the imaging heads for adjusting a power of the light beams of the radiation sources separately for each imaging head;

a photoelectric sensor connected to the control device; and at least one light guide disposed to guide a portion of the light emanating from the radiation sources to the photoelectric sensor.

In other words, the objects of the invention are achieved in that a light guide is provided between an imaging head, which includes a multiplicity of individually drivable radiation sources, and a photoelectric sensor. The light guide guides a portion of the radiation emanating from the imaging head, in particular scattered radiation, onto the receiver surface of the sensor. In the case of a number of imaging heads, each imaging head is assigned a dedicated light guide. The light guides are then brought together at the end on the light exit side, and directed onto the receiver surface of the sensor.

In a particular embodiment, a rod-shaped light guide can be provided between two imaging heads. The rod-shaped light guide is arranged parallel to the axis of rotation of a printing form cylinder, and captures light that is situated upstream of an aperture stop or a shutter in the beam path of the radiation sources. The photosensor is arranged between the light-receiving ends of the light guide for the purpose of measuring the light power.

In accordance with an added feature of the invention, a light-reflecting aperture stop or shutter is disposed between the radiation sources and the recording medium. The light guide is disposed to lie in a reflected light generated by the aperture stop.

In an alternative embodiment of the invention, the light guides have light entry surfaces disposed in each case in a housing of a respective imaging head.

In accordance with a concomitant feature of the invention, sensor is a photodiode.

Other features which are considered as characteristic for the invention are set forth in the appended claims.

Although the invention is illustrated and described herein as embodied in an apparatus for imaging on a recording medium, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
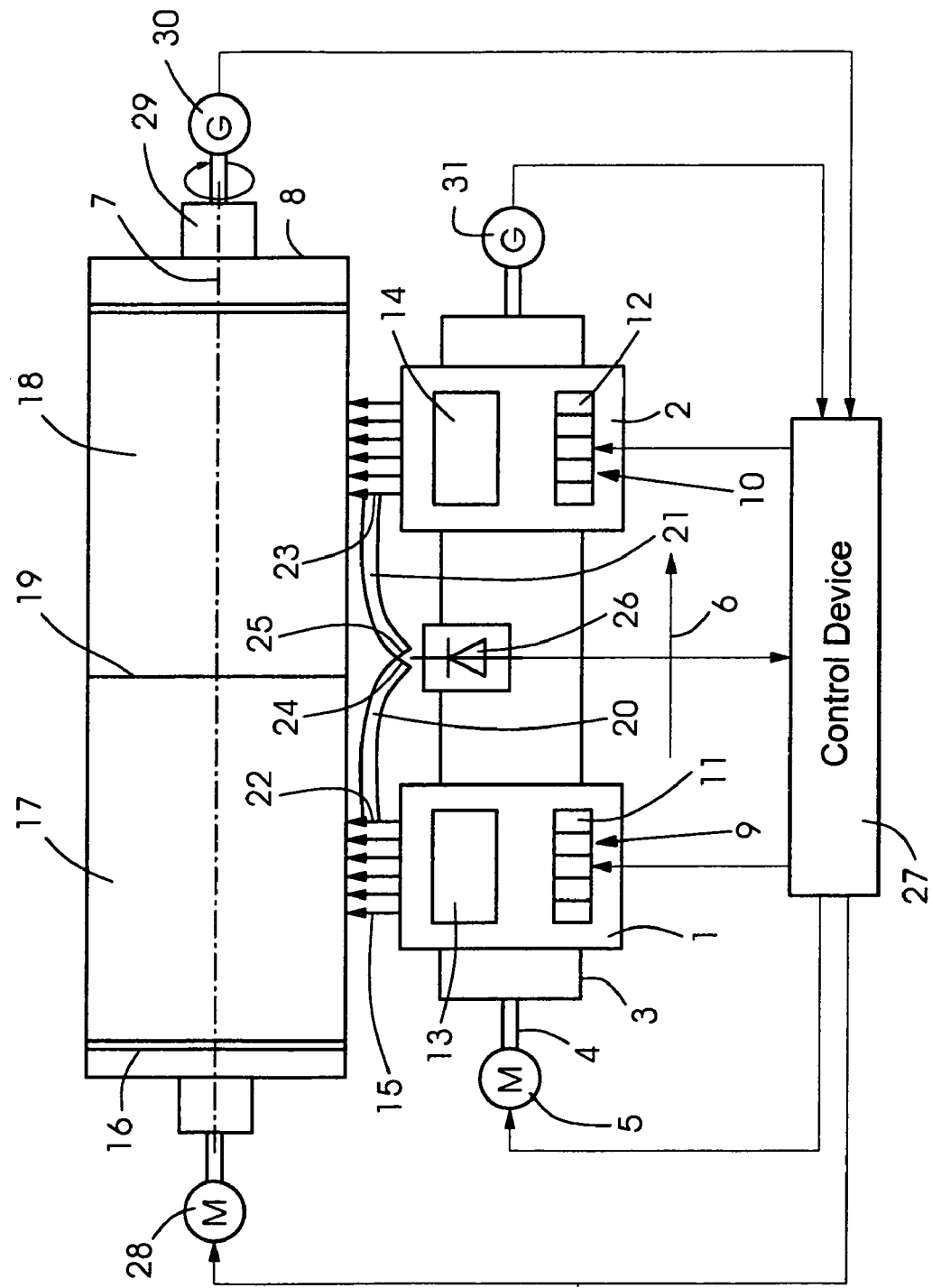
FIG. 1 is a schematic view of an imaging apparatus with two imaging heads and two light guides.

Referring now to the figures of the drawing in detail and first, particularly, to FIG. 1 thereof, there is shown a schematic of an imaging apparatus with two imaging heads 1, 2. The imaging heads 1, 2 are disposed on a slide 3 and can be positioned by way of a screw drive 4 or spindle drive and a stepping motor 5 in a direction 6 that is parallel to the axis 7 of rotation of a printing form cylinder 8. Each imaging head 1, 2 includes a laser diode array 9, 10 with in each case 64 individually drivable laser diodes 11, 12. The laser diodes 11, 12 are aligned at equal spacings of 200 micrometers along a straight line that lies parallel to the direction 6. The laser diodes 11, 12 can be driven in accordance with the image, and respectively transmit individual beams 15 via an optic 13, 14 in a direction perpendicular to the axis 7 of rotation. The individual beams 15 strike a printing form blank 16 that is clamped onto the circumferential surface of the printing form cylinder 8. Each imaging head 1, 2 produces on the printing form blank 16 image points in imaging sections 17, 18 that butt together, or adjoin one another, without a gap at a module boundary 19.

For the purpose of power measurement there are provided two light guides 20, 21 whose light entry surfaces 22, 23 are in each case situated in the beam path of the laser beams 15 of the imaging heads 1, 2. The light exit surfaces 24, 25 are brought together at a photodiode 26. The photodiode 26 is connected to a control device 27. The control device 27 is, furthermore, connected to the laser diode arrays 9, 10, for the purpose of driving in accordance with the image and of controlling power. The control device 27 is also connected to the motors 5 and 28 for the purpose of driving the screw drive 4 and the printing form cylinder 8. Rotary encoders 30, 31 are coupled at an axle journal 29 of the printing form cylinder 8 and to the screw drive 4, and they are connected to the control device 27. The rotary encoder 30 supplies signals that are proportional to the angle of rotation of the printing form cylinder 8. The rotary encoder 31 generates signals that are proportional to the advance travel of the imaging heads 1, 2 in the direction 6.

The radiant power of the laser diodes 11, 12 is calibrated for each imaging head 1, 2 before the imaging of a printing form blank 16. To this end, the conducting-state current is set for each laser diode 11, 12 with the aid of the control device 27, and stored, such that all the laser diodes 11, 12 of a laser diode array 9, 10 emit the same desired power in the driven state. Subsequently, the power of the laser diode arrays 9, 10 are balanced with one another. The aim is to set the power such that there are no longer any density differences present in the imaging sections 17, 18 and so the module boundary 19 is not visible in the printed image.

In order to balance the powers of the laser diode arrays 9, 10 relative to one another, the imaging heads 1, 2 are taken into operation one after another by driving a defined number of laser diodes 11, 12 with the aid of a prescribed conducting-state current. A portion of the scattered radiation thereby produced passes into the light entry surface 22, 23 of the respective light guide 20, 21. The photodiode 26 receives a signal proportional to the laser power and that signal is processed in the control device 27. The measured power values of the two laser diode arrays 9, 10 are compared in the control device 27. The currents of the laser diodes 11, 12 of one laser diode array 9, 10 or both laser diode arrays 9, 10 are set as a function of the difference between two measured power values such that the power is equal. The power balancing is undertaken manually or automatically at defined intervals.

Figure 2:
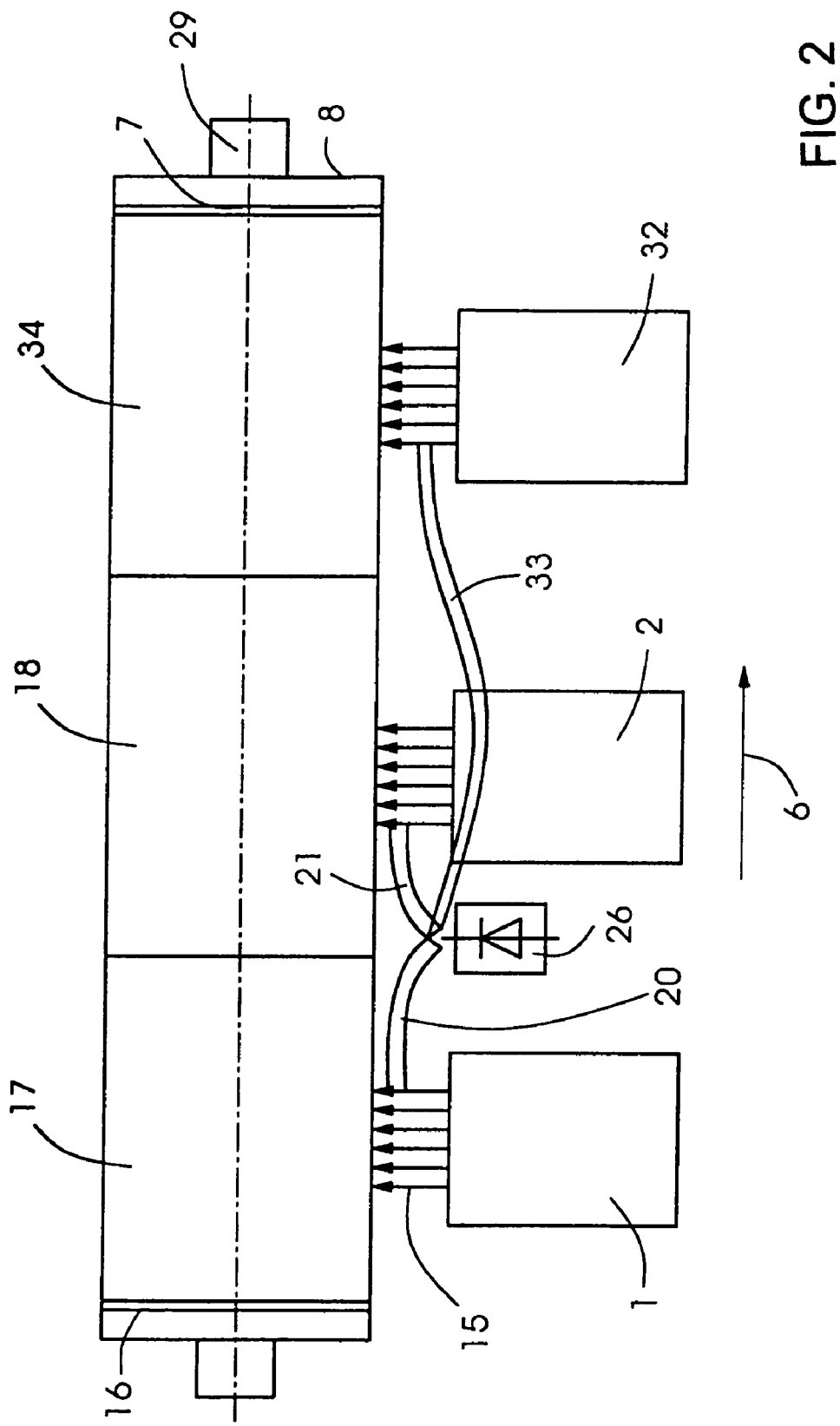
FIG. 2 is a schematic view of an imaging apparatus with three imaging heads and three light guides.

Referring now to FIG. 2, there is shown an exemplary embodiment with three imaging heads 1, 2, 32 and three light guides 20, 21, 33. In order to balance the laser power in three imaging sections 17, 18, 34, scattered light at the output of the imaging heads 1, 2, 32 is led sequentially with the aid of the light guides 20, 21, 33 onto a photodiode 26. The photodiode 26 is located between the imaging heads 1, 2, the light exit surfaces of all the light guides 20, 21, 23 being directed onto the receiver surface of the photodiode 26. In a way similar to the mode of procedure described in relation to FIG. 1, three measured power values are compared in a control device 27, and the conducting-state currents of the laser diodes 11, 12 of all the imaging heads 1, 2, 32 are set to the same laser power output.

Figure 3:
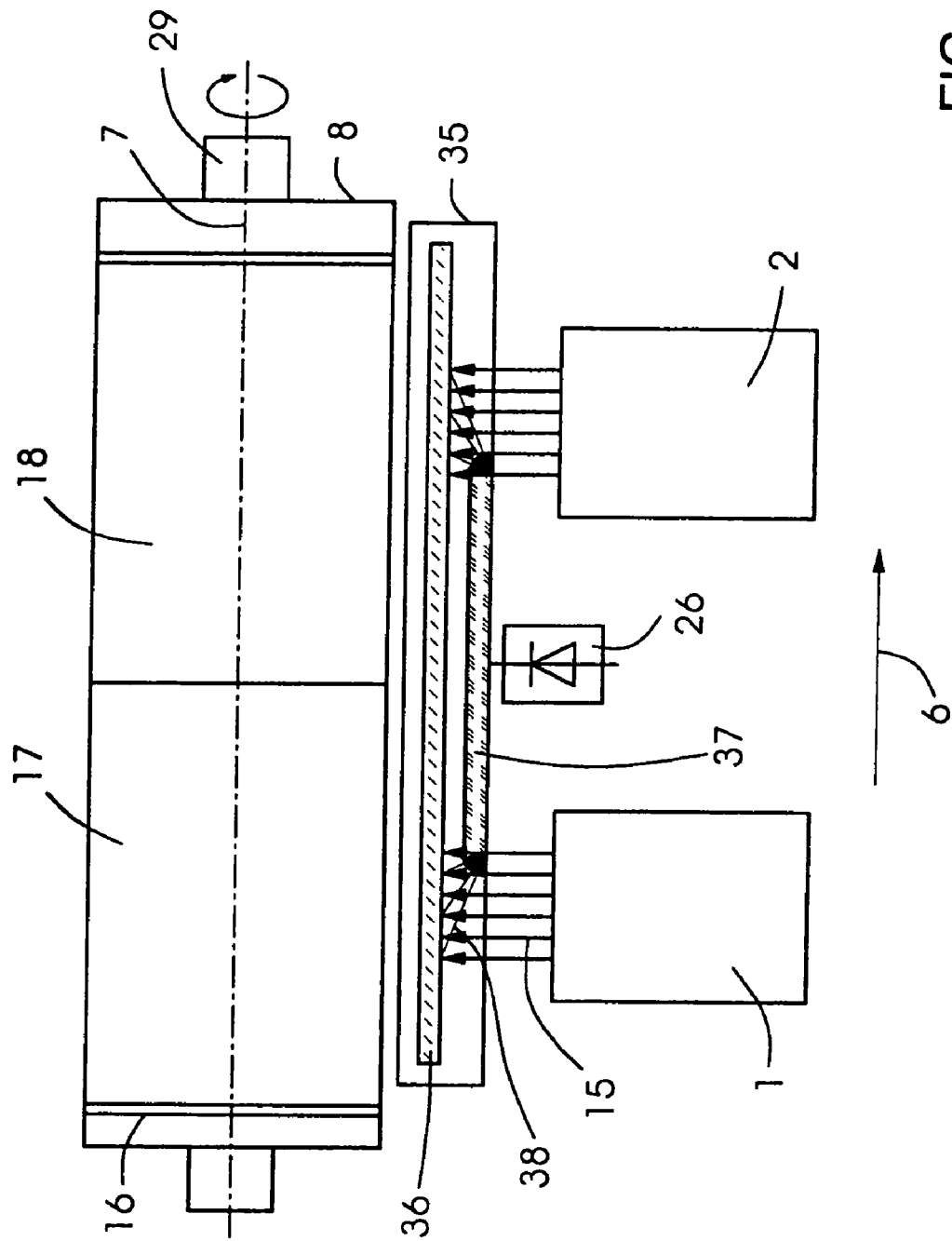
FIG. 3 is a schematic view of an imaging apparatus with two imaging heads and one rod-shaped light guide.

In the alternative embodiment shown in FIG. 3 with two imaging heads 1, 2, a suction housing 35 or suction box 35 and a shutter 36 are disposed between the imaging heads 1, 2 and the printing form cylinder 8. During imaging, there is an air flow in the suction housing 35 that prevents the optical components of the imaging heads 1, 2 from being soiled. The shutter is brought into the beam path when no beams 15 are to reach the printing form blank 16. A rod-shaped light guide 37 is arranged in the suction housing 35 in order to detect a portion of the beams 15 emanating from the imaging heads 1, 2. The light guide 37 is parallel to the axis 7 of rotation. The ends of the light guide 37 project symmetrically so far into the beam path that scattered radiation 38 emanating from the shutter 36 is detected under identical conditions. The shutter 36 is coated and shaped such that the beams 15 are coupled into the light guide 37 diffusely or reflected at a defined angle. The photodiode 26 is preferably arranged on the light guide 37 and measures the radiant power coupled sequentially by the imaging heads 1 and 2 into the light guide 37.

Figure 4:
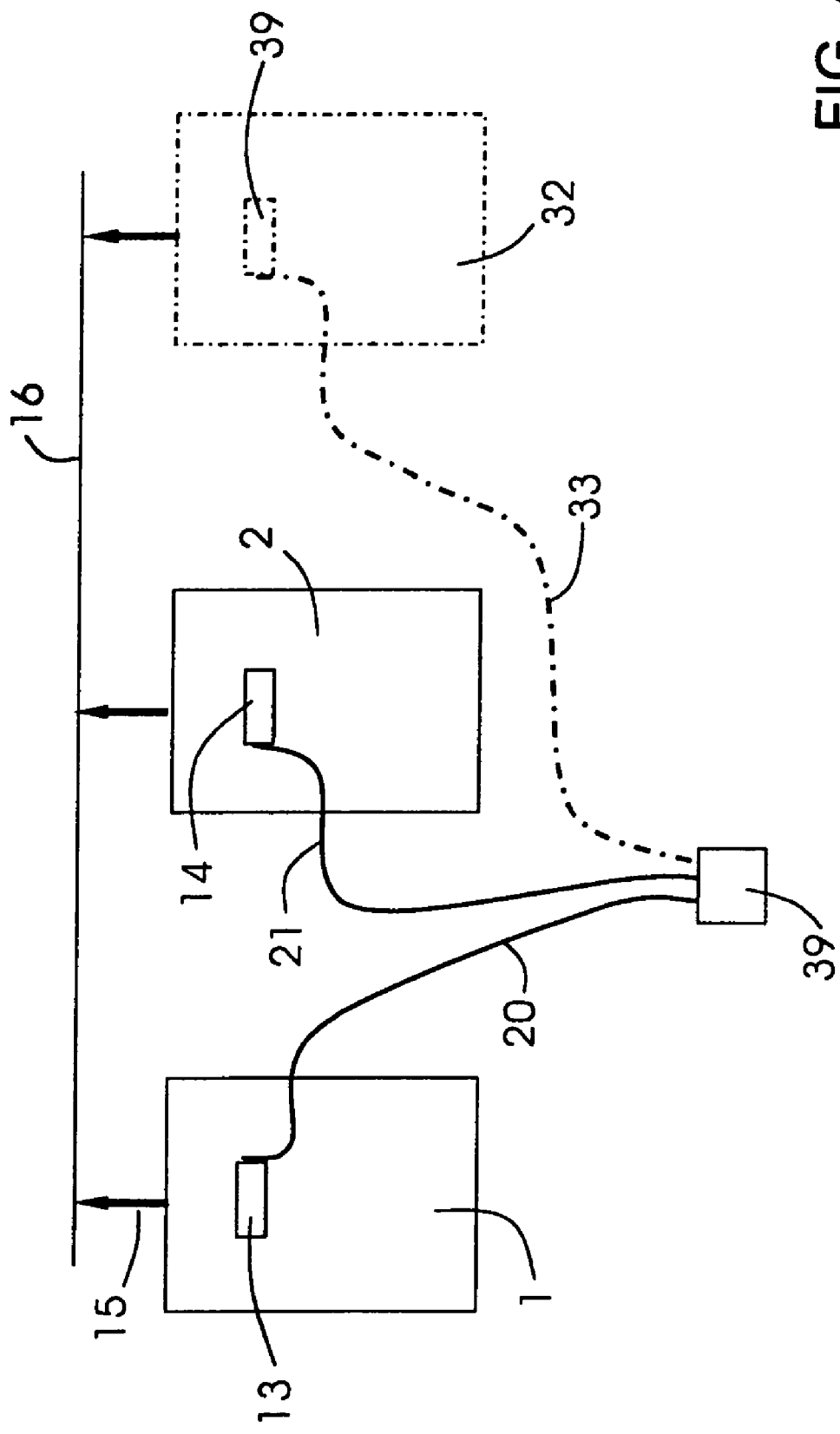
FIG. 4 is a schematic view of an imaging apparatus with three imaging heads and reception of light respectively in the housing of the imaging heads.

In the alternative embodiment according to FIG. 4 with three imaging heads 1, 2, 32 and three light guides 20, 21, 33, the light guides 20, 21, 33 are respectively guided through the housing of an imaging head 1, 2, 32 into the effective range of the optics 13, 14, 39. Scattered radiation that is proportional to the beams 15 emitted by the laser diodes 11, 12 and emanates in each case from optical elements and from the printing form blank 16 pass into the light entry surfaces of the light guides 20, 21, 33. The scattered radiation of the imaging heads 1, 2, 32 passes sequentially onto the receiver surface of a power sensor 39. As described above, the conducting-state currents of the laser diodes 11, 12 are set from a comparison of the measured power values.

This application claims the priority, under 35 U.S.C. § 119, of German patent application No. 10 2004 051 322.8, filed Oct. 21, 2004; the entire the disclosure of the prior application is herewith incorporated by reference.

We claim:

1. An apparatus for imaging on a recording medium, the apparatus comprising:
at least two imaging heads each having a multiplicity of individual radiation sources electrically driven individually to direct respective light beams onto a radiation-sensitive layer of the recording medium;
a drive for moving the recording medium and said radiation sources relative to one another;
a control device connected to said imaging heads for adjusting a power of the light beams of said radiation sources separately for each imaging head;
a photoelectric sensor connected to said control device; and
at least one light guide disposed to guide a portion of the light emanating from said radiation sources to said photoelectric sensor, each said imaging head being assigned a respective light guide, and said light guides from each imaging head converging at said sensor.

2. The apparatus according to claim 1, wherein said photoelectric sensor has a receiver surface and said light guides are disposed to conduct the portion of the light onto said receiver surface.

3. The apparatus according to claim 1, wherein said sensor is a photodiode.

4. An apparatus for imaging on a recording medium, the apparatus comprising:
at least two imaging heads each having a multiplicity of individual radiation sources electrically driven individually to direct respective light beams onto a radiation-sensitive layer of the recording medium;
a drive for moving the recording medium and said radiation sources relative to one another;
a control device connected to said imaging heads for adjusting a power of the light beams of said radiation sources separately for each imaging head;
a photoelectric sensor connected to said control device; and
at least one light guide disposed to guide a portion of the light emanating from said radiation sources to said photoelectric sensor, said light guide being a rod-shaped light guide formed with light-receiving ends, said light guide being disposed between two imaging heads, and said sensor being disposed between said light-receiving ends of said light guide.

5. The apparatus according to claim 4, which comprises a light-reflecting aperture stop disposed between said radiation sources and the recording medium, and wherein said light guide is disposed to lie in a reflected light generated by said aperture stop.

6. An apparatus for imaging on a recording medium, the apparatus comprising:
at least two imaging heads each having a multiplicity of individual radiation sources electrically driven individually to direct respective light beams onto a radiation-sensitive layer of the recording medium;
a drive for moving the recording medium and said radiation sources relative to one another;
a control device connected to said imaging heads for adjusting a power of the light beams of said radiation sources separately for each imaging head;
a photoelectric sensor connected to said control device; and
at least one light guide disposed to guide a portion of the light emanating from said radiation sources to said photoelectric sensor, said light guides having light entry surfaces disposed in each case in a housing of a respective said imaging head.

* * * * *